United States Patent
Yan

(10) Patent No.: US 7,501,971 B2
(45) Date of Patent: Mar. 10, 2009

(54) ANALOG-TO-DIGITAL CONVERTER WITH RESISTOR RATIO

(75) Inventor: Hai Yan, Fontana, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/710,798

(22) Filed: Feb. 26, 2007

(65) Prior Publication Data

US 2008/0204294 A1  Aug. 28, 2008

(51) Int. Cl.
*H03M 1/12* (2006.01)

(52) U.S. Cl. .................. 341/155; 341/161

(58) Field of Classification Search .......... 341/155, 341/161, 172
See application file for complete search history.

(56) References Cited

U.S. PATENT DOCUMENTS

| | | | | |
|---|---|---|---|---|
| 5,548,287 A | * | 8/1996 | Gendai | 341/133 |
| 5,726,563 A | * | 3/1998 | Bolton, Jr. | 323/315 |
| 5,955,899 A | * | 9/1999 | Afghahi | 327/65 |
| 6,400,300 B1 | * | 6/2002 | Leung et al. | 341/154 |
| 6,882,207 B2 | * | 4/2005 | Fujiyama et al. | 327/307 |

* cited by examiner

*Primary Examiner*—Peguy JeanPierre
(74) *Attorney, Agent, or Firm*—Schwegman, Lundberg & Woessner, P.A.

(57) ABSTRACT

Various embodiments disclose apparatus, systems, and methods operating with a first circuit branch with transistors coupled in series between first and second supply nodes, and a second circuit branch with second transistors coupled in series between the first and second supply nodes. The second circuit branch may include a resistive unit coupled in series with the second transistors. The first and second circuit branches may receive analog information and to provide digital output information. The digital output information may include output values based on a relationship between a voltage across the first resistive unit and a voltage difference between first and second components of the analog input information. Other embodiments disclose additional apparatus, systems, and methods.

46 Claims, 9 Drawing Sheets

ANALOG-TO-DIGITAL CONVERTER WITH RESISTOR RATIO

FIELD

This disclosure relates to semiconductor devices, including analog-to-digital converters.

BACKGROUND

Semiconductor devices such as memory devices and electronic sensor devices may have a converter to convert analog information into digital information. The converter may operate to compare the analog information with a voltage to determine the values for the digital information. Some converters may have numerous capacitors and switches to generate the voltage for the comparison. Such capacitors and switches can occupy a relatively large area in the device, increasing the cost of manufacture. Thus, there is a need for improved apparatus, systems, and methods that reduce the area occupied by capacitors and switches in converters.

DETAILED DESCRIPTION

Figure 1:
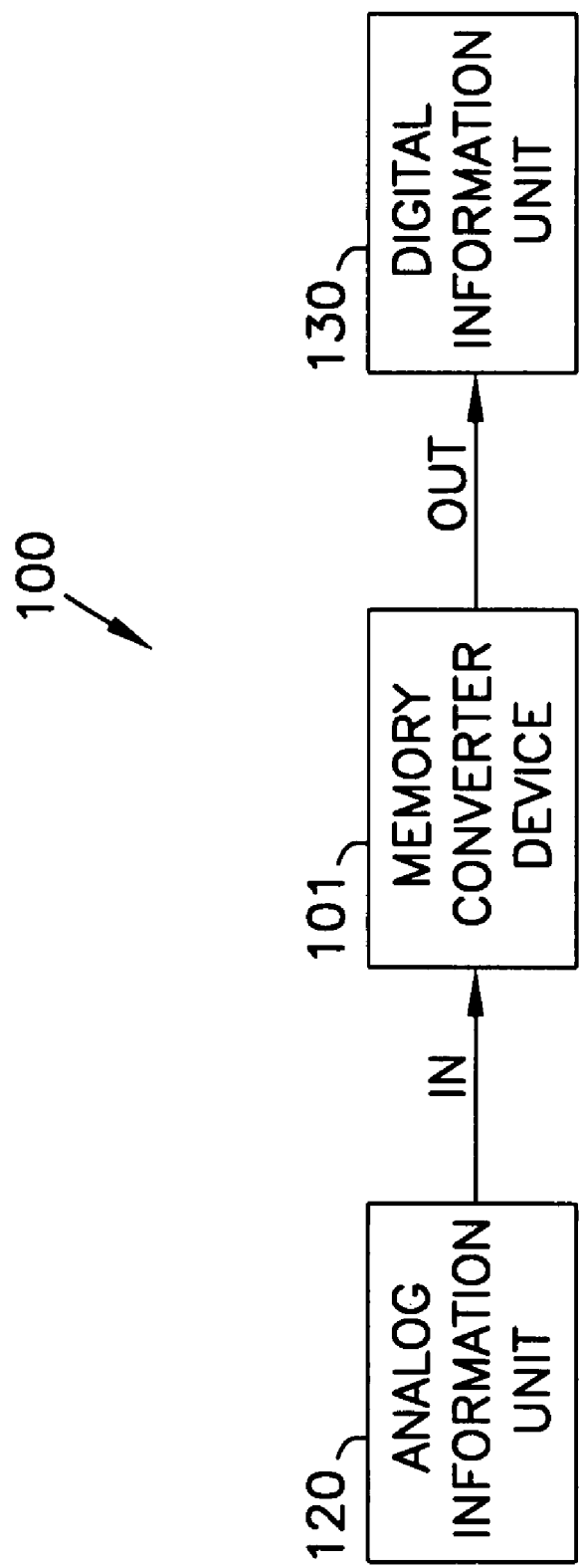
FIG. 1 is a block diagram of an apparatus including a converter according to an embodiment of the invention.

FIG. 1 is a block diagram of an apparatus 100 including a converter 101 according to an embodiment of the invention. Converter 101 may receive input information IN and provide output information OUT related to IN. An analog information unit 120 may provide the analog input information IN. The input information IN may include one or more signals that represent analog information. A digital information unit 130 may receive the digital output information OUT for further processing. The output information OUT may include one or more signals that represent digital information, such as one or more logic 0 (binary "0") and logic 1 (binary "1") symbols. Thus, converter 101 may be considered as an analog-to-digital converter (ADC) to convert analog input information, e.g., the input information IN, into digital output information, e.g., the output information OUT. Converter 101 may comprise an embodiment of the converter shown in FIG. 2 and/or FIG. 5.

Figure 2:
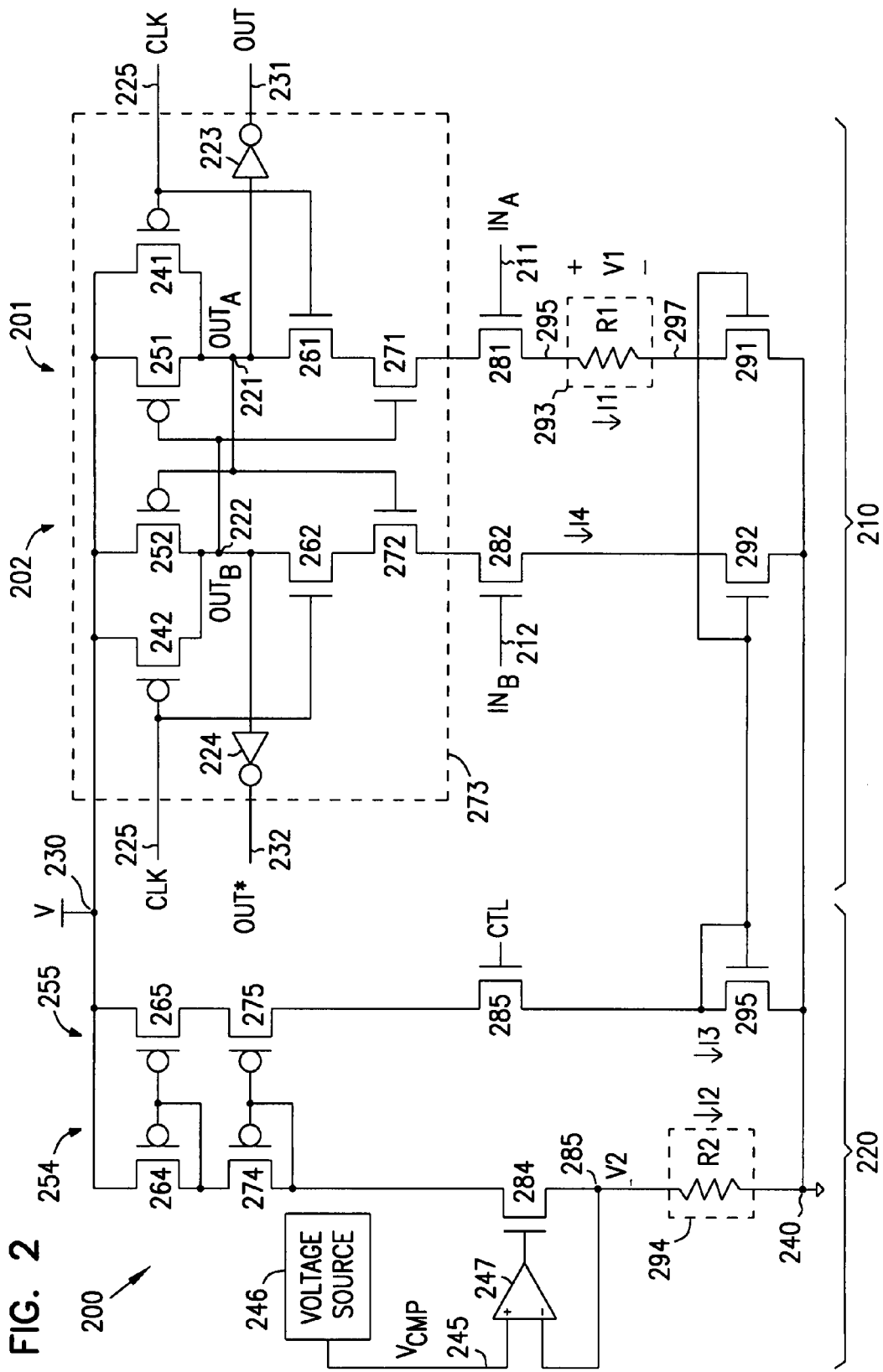
FIG. 2 is a schematic diagram of a converter according to an embodiment of the invention.

FIG. 2 is a schematic diagram of a converter 200 according to an embodiment of the invention. Converter 200 may comprise an ADC. Converter 200 may include circuits 210 and 220 coupled to supply nodes 230 and 240, respectively. Node 230 may be coupled to a voltage V. Node 240 may be coupled to a ground potential. Voltage V may include a supply voltage of converter 200 or a supply voltage of a device within which converter 200 may reside. Circuit 220 may serve as a bias circuit to set a voltage value of a voltage V1 across a resistive unit 293 of circuit 210. Circuit 210 may serve as a comparator circuit to compare input information $IN_A$ and $IN_B$ at nodes 211 and 212, and provide output information $OUT_A$, OUT, $OUT_B$, and OUT* at nodes 221, 231, 222, and 232, respectively.

$IN_A$ and $IN_B$ may include input signals that represent analog information. $IN_A$ and $IN_B$ may be considered as first and second components of the input information. For example, $IN_A$ and $IN_B$ may include differential signals in which each of the signals $IN_A$ and $IN_B$ may change, as they are carried on two conductors and the signal value is the difference between the individual voltages on each conductor. In another example, $IN_A$ and $IN_B$ may include single-ended signals in which one of $IN_A$ and $IN_B$ (e.g., $IN_B$) may remain unchanged, while the other (e.g., $IN_A$) may vary, such as when one conductor is connected to a reference voltage, including ground or a power source, while the other carries a varying voltage that represents the desired signal.

Output information $OUT_A$, OUT, $OUT_B$, and OUT* may include signals that represent digital information (e.g., logic 0 and logic 1). Output information $OUT_A$ or OUT may be considered as a first component of the output information, and $OUT_B$ or OUT* may be considered as a second component of the output information. Output information OUT may represent an inversion of $OUT_A$ and OUT* may represent an inversion of $OUT_B$. Output information $OUT_A$ and $OUT_B$ may include complementary values. Thus, output information OUT and OUT* may also include complementary values. For example, output information OUT may have logic 1 value when output information OUT* has a logic 0 value.

In operation, the values of output information OUT and OUT* (or $OUT_A$ and $OUT_B$) may be determined by the relationship between V1 and the difference in voltage values between $IN_A$ and $IN_B$. As shown in FIG. 2, V1 may represent a voltage across resistive unit 293 between nodes 295 and 297. Expressions (1) and (2) below show example values for output information OUT and OUT* based on V1, $V_{INA}$, and $V_{INB}$. $V_{INA}$ and $V_{INB}$ may correspond to the voltage values of $IN_A$ and $IN_B$, respectively.

$$\text{OUT=logic 1 (or OUT*=0) when } V_{INA}-V_{INB} \geq V1 \quad (1)$$

$$\text{OUT=logic 0 (or OUT*=1) When } V_{INA}-V_{INB} < V1 \quad (2)$$

As shown in expressions (1) and (2), OUT=logic 1 when the difference in voltage values of $IN_A$ and $IN_B$, $V_{INA}-V_{INB}$, is equal to or greater than V1 (at least equal to V1). OUT=logic 0 when $V_{INA}-V_{INB}$ is less than V1. Thus, converter 200 of FIG. 2 may use V1 as a reference or decision point to switch each of output information OUT or OUT* between logic 0 and logic 1 based on V1 and $V_{INA}-V_{INB}$. Hence, V1 may be considered as a "built-in" or integral reference voltage of converter 200. The built-in or integral reference voltage may allow converter 200 to have a reduced circuit area in comparison with other converters or comparators because the other converters may use additional circuit elements, e.g., capacitors and switches, to generate the reference voltage for use in the comparison of the input information.

Circuit 210 of FIG. 2 may include a node 225 to receive information CLK. Converter 200 may use information CLK to control timing of the output information $OUT_A$, OUT, $OUT_B$, and OUT, and to precharge nodes 221 and 222, as explained in more detail with reference to FIG. 3. In FIG. 2, circuit 210 may include an inverter 223 to provide output information OUT (inversion of output information $OUT_A$) at a node 231, and an inverter 224 to provide output information OUT* (inversion of output information $OUT_B$) at a node 232. In some embodiments, circuit 210 may omit one or both of inverters 223 and 224.

Circuit 210 may include circuit branches 201 and 202. Circuit branch 201 may include transistors 241, 251, 261, 271, 281, and 291, and resistive unit 293. Circuit branch 202 may include transistors 242, 252, 262, 272, 282, and 292. Portion 273 of circuit 210 may be referred to as an output unit of circuit 210. Transistors 281 and 282 may be referred to as input transistors to receive $IN_A$ and $IN_B$. As shown in FIG. 2, circuit branches 201 and 202 may be asymmetrical, having an unequal number of circuit elements. For example, circuit branch 201 may include one circuit element (resistive unit 293) more than circuit branch 202.

In circuit branch 201, transistors 251, 261, 271, 281, and 291 may be coupled in series between nodes 230 and 240 such that a non-gate terminal of one transistor in the series may be coupled to a non-gate terminal of another transistor in the series or to one of the nodes 230 and 240.

In circuit branch 202, transistors 252, 262, 272, 282, and 292 may be coupled in series between nodes 230 and 240 such that a non-gate terminal of a transistor in the series may be coupled to a non-gate terminal of another transistor in the series or to one of the nodes 230 and 240.

In this description, a non-gate terminal of a transistor refers to either a source terminal or a drain terminal of the transistor. For example, in transistor 251, a non-gate terminal may refer to either a source terminal of transistor 251 coupled to node 230 or a drain terminal of transistor 251 coupled to a non-gate terminal (drain terminal) of transistor 261 at node 221.

Transistors 251, 271, 252, and 272 may form cross-coupled inverters to provide complementary values (logic 0 and logic 1) for output information $OUT_A$ and $OUT_B$ (and output information OUT and OUT*).

Transistors 251 and 271 of circuit branch 201 may form an inverter to provide an inversion of output information $OUT_B$ as $OUT_A$ at node 221 when transistor 261 turns on. As shown in FIG. 2, transistors 251 and 271 may include gates coupled to node 222 to serve as an input node of the inverter to receive output information $OUT_B$, and a non-gate terminal of each of transistors 251 and 271 coupled to node 221 to serve as an output node of the inverter to provide output information $OUT_A$ (inversion of output information $OUT_B$).

Transistors 252 and 272 of circuit branch 202 may form an inverter to provide an inversion of output information $OUT_A$ as $OUT_B$ at node 222 when transistor 262 turns on. As shown in FIG. 2, transistors 252 and 272 may include gates coupled to node 221 to serve as an input node of the inverter to receive output information $OUT_A$, and with a non-gate terminal of each of transistors 252 and 272 coupled to node 222 to serve as an output node of the inverter to provide output information $OUT_B$ (inversion of output information $OUT_A$).

A current I1 may flow through resistor R1 of resistive unit 293 such that I1=V1/R1 or V1=I1*R1. Thus, the value of V1 may be set or chosen by setting or choosing the values for current I1 and resistor R1.

As mentioned above, circuit 220 may serve as a bias circuit to set a voltage value of voltage V1 across resistive unit 293. Circuit 220 may receive a voltage $V_{CMP}$ at a node 245 to generate a current I2 through a resistor R2 of a resistive unit 294. Circuit 220 may include an operational amplifier (op-amp) 247 having a first input node coupled to node 245 and a second input node coupled to a node 286. A voltage V2 at node 286 may present a voltage across resistor R2 between nodes 286 and 240. Thus, current I2=V2/R2. Because of the virtual ground characteristic of some op-amps, such as op-amp 247, voltage V2 may be substantially equal to voltage $V_{CMP}$ (V2=$V_{CMP}$). Thus, current I2=V2/R2 may be expressed as current I2=V2/R2=$V_{CMP}$/R2.

As mentioned above, current I1=V1/R1 and current I2=$V_{CMP}$/R2. Thus, the relationship between V1/R1 and $V_{CMP}$/R2 may be determined when current I1 is related to current I2, for example, when current I1=current I2 or when current I1=X*I2 (X times I2), where X may be a fraction or an integer equal to or greater than two. For example, when current I1=current I2, V1/R1=$V_{CMP}$/R2 or V1=$V_{CMP}$ (R1/R2), where (R1/R2) corresponds to the ratio of a resistance value of resistive unit 294 and a resistance value of resistive unit 293. In the situation where I1=X*I2, V1/R1=X*($V_{CMP}$/R2), or V1=$V_{CMP}$ (X*(R1/R2)). Circuit 220 may use current I2 provide current I1 such that I1=I2 or I1=X*I2. As discussed above, the value of voltage V1 may be set by choosing the values for current I1 and resistor R1. However, when current I1 is related to current I2, for example, when current I1=current I2 or when current I1=X*I2, the value of voltage V1 may be set by choosing the values for current I2 and resistor R1. Since current I2=$V_{CMP}$/R2, the value of voltage V1 may be set by choosing the values for voltage $V_{CMP}$, resistor R2, and resistor R1. The value of voltage V1 may be set by various ways.

In a first example, the value of voltage V1 may be set by fixing (keeping constant) the value of resistor R1, and varying the value of one or both of voltage $V_{CMP}$ and of resistor R2.

In a second example, the value of voltage V1 may be set by fixing the value of resistor R2, and varying the value of one or both of voltage $V_{CMP}$ and of resistor R1.

In a third example, the value of voltage V1 may be set by fixing the value of voltage $V_{CMP}$, and varying the value of one or both of resistor R1 and of resistor R2.

In a fourth example, the value of voltage V1 may be set by fixing the ratio of R1/R2 (e.g., (R1/R2)=1 or R1=R2), and choosing the value of voltage $V_{CMP}$ such that the value of voltage V1 may be substantially equal or equal to the value of voltage $V_{CMP}$.

From the above examples, one or both of resistive units 293 and 294 may include a fixed resistor (resistors R1, R2, or both may be fixed) or a variable resistor (resistors R1, R2, or both may be variable) for purposes of setting the value for voltage V1 to affect the decision point, or the point at which of converter 200 switch each of output information OUT or OUT* between logic 0 and logic 1 based on V1 and $V_{INA}$-$V_{INB}$. One or both of resistive units 293 and 294 may include a variable resistor with transistors coupled in parallel, such as the transistors of FIG. 4. In some embodiments, converter 200 may be programmable, such that the value of one or both resistors R1 of R2 may be varied by asserting programming codes such as those described with reference to FIG. 4.

In FIG. 2, circuit 220 may include a circuit portion 254 having transistors 264, 274, 284, and resistive unit 294, and a circuit portion 255 having transistors 265, 275, 285, and 295. Transistor 285 may be turned on or off by control information CTL, which may include a signal with a voltage value equal to a midpoint or common mode value of the voltage values of $IN_A$ and $IN_B$. Transistor 285 may provide matching circuit elements between circuit portion 255 and each of circuit branches 201 and 202 (e.g., transistor 285 matches each of transistors 281 and 282). In some embodiments, circuit 220 may omit transistor 285 such that transistor 275 may be coupled directly to transistor 295, rather than indirectly, as shown.

In FIG. 2, it can be seen that circuit portions 254 and 255 may couple to each other (e.g., via transistors 264, 274, 265, and 275) to provide a current mirror to mirror current I2 to generate current I3. Circuit portion 255 and circuit branch 202 may couple to each other (e.g., via transistors 295 and 292) to provide a current to mirror current I3 to generate current I4. Circuit portion 255 and circuit branch 201 may couple to each other (e.g., via transistors 295 and 291) to provide a current to mirror current I3 to generate current I1. The current mirrors formed by circuit portions 254 and 255, and circuit branches 201 and 202 may thus cause current I1 to be related to current I2. Converter 200 may be configured or constructed (e.g., by choosing the size of the transistors in FIG. 2) such that current I1=current I2 or current I1=X*I2. As discussed above, when current I1=current I2 or when current I1=X*I2, the value of voltage V1 may be set by choosing the values for voltage $V_{CMP}$, resistor R2, and resistor R1 such that voltage V1 may be a function of the voltage $V_{CMP}$ and the ratio of R2/R1.

In some embodiments, voltage $V_{CMP}$ may be provided by a voltage source 246. Voltage source 246 may include a bandgap voltage generator. A voltage, such as voltage $V_{CMP}$, provided by a bandgap voltage generator may remain substantially unchanged over various operating conditions (e.g., operating supply voltage and operating temperature). Thus, in some embodiments, voltage $V_{CMP}$ may remain substantially unchanged. The comparison function of converter 200 may be improved when $V_{CMP}$ remains substantially unchanged.

As described above, the value of voltage V1 may be substantially equal or equal to the value of voltage $V_{CMP}$ when the ratio of (R1/R2)=1 or resistor R1=resistor R2. Thus, in some embodiments, the voltage value across resistor R1 (e.g., voltage V1) may be substantially equal or equal to the voltage value across resistor R2 (e.g., voltage V2). Here, "substantially equal" means the intended values of two voltages (e.g., voltage V1 and voltage $V_{CMP}$, or voltage V1 and voltage V2) may be set or designed to be an equal value. However, in some embodiments, two voltage values (e.g., voltage V1 and voltage $V_{CMP}$, or voltage V1 and voltage V2), that are intended to be equal, may be "substantially equal" such that a voltage difference between the two voltages may occur. For example, voltage V1 and voltage $V_{CMP}$, or voltage V1 and voltage V2, may be "substantially equal" such that a voltage difference of less than 100 millivolts may occur between voltage V1 and voltage $V_{CMP}$ or between voltage V1 and voltage V2.

In some embodiments, voltage $V_{CMP}$ may be coupled to circuit 220 in an arrangement different from the arrangement shown in FIG. 2 such that the relationship voltage V1=$V_{CMP}$*(R1/R2), or current I1=current I2, or current I1=X*I2, or current I2=$V_{CMP}$/R2, or current I2=V2/R2 may remain true. For example, voltage $V_{CMP}$ may be coupled directly to circuit 220 without making use of an op-amp, such as op-amp 247.

FIG. 2 shows an example embodiment of converter 200 using p-channel metal-oxide-semiconductor (PMOS) transistors and n-channel metal-oxide-semiconductor (NMOS) transistors arranged in a way shown in FIG. 2. In some embodiments, converter 200 may have an arrangement such that PMOS transistors may be replaced by NMOS transistors, and NMOS transistors may be replaced by PMOS transistors, and the polarities of supply nodes 230 and 240 may be swapped.

In some embodiments, converter 200 may omit output information $OUT_B$ and OUT* and include one or both of output information $OUT_A$ and OUT as output information. In other embodiments, converter 200 may omit output information $OUT_A$ and OUT and include one or both of output information $OUT_B$ and OUT* as output information.

Figure 3:
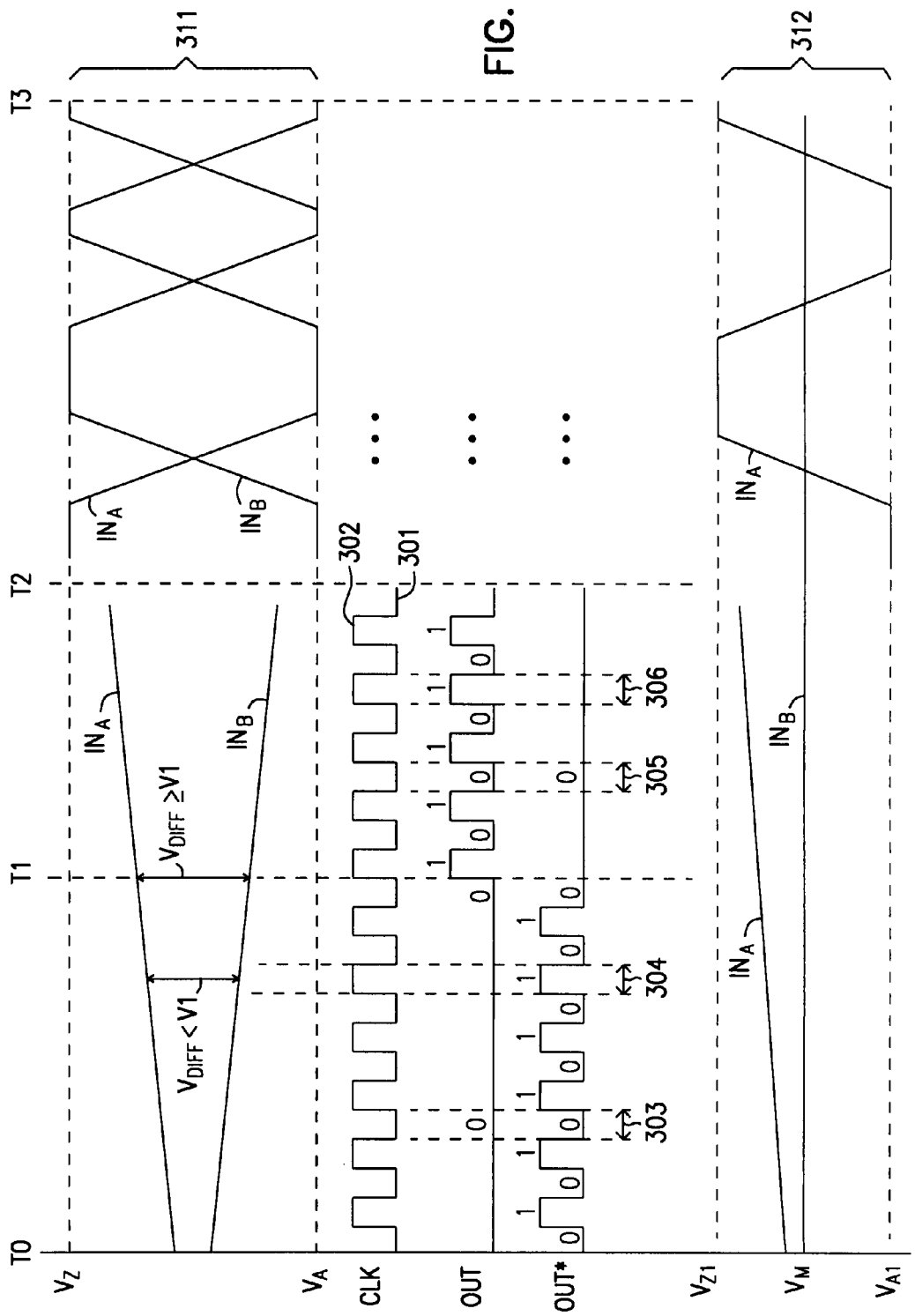
FIG. 3 shows an operational timing diagram that may be associated with the converter of FIG. 2.

FIG. 3 shows an operational timing diagram that may be associated with the converter 200 of FIG. 2. Portion 311 illustrates input information $IN_A$ and $IN_B$ including differential signals such that each of the input information $IN_A$ and $IN_B$ may vary between voltages $V_A$ and $V_Z$. Portion 312 illustrates input information $IN_A$ and $IN_B$ including single-ended signals such that one of the input information $IN_A$ and $IN_B$ (e.g., input information $IN_B$) may remain substantially unchanged at a selected voltage value while the other one (e.g., input information $IN_B$) may vary within a voltage range. For example, in portion 312, input information $IN_B$ may remain unchanged at a voltage value $V_M$ while input information $IN_A$ may vary or swing within a voltage range from $V_{A1}$ to $V_{Z1}$ with $V_{A1}$ being the lowest voltage of the voltage range.

As shown in portion 311 of FIG. 3, each of input information INA and $IN_B$ may include a signal with a voltage range from $V_A$ to $V_Z$, where $V_A$ may represent the lowest voltage of the voltage range. Voltage $V_Z$ may be equal to voltage V at node 230 of FIG. 2. In some embodiments, voltage $V_A$ (or $V_{A1}$) may be at least equal to (or greater than the threshold voltage (Vt) of each of transistors 281 and 282 of FIG. 2 such that both transistors 281 and 282 turn on when information $IN_A$ and $IN_B$ are received. For example, when the threshold voltage Vt of each of transistors 281 and 282 of FIG. 2 is about 0.7 volt, $V_A$ (FIG. 3) or voltage $V_{A1}$ may be equal to or greater than 0.7 volt.

FIG. 3 shows an example of enlarged segments of input information $IN_A$ and $IN_B$ between times T0 and T2 to focus on the relationship between voltage V1 and voltage $V_{DIFF}$, where voltage $V_{DIFF}$ represents the difference in voltages between input information $IN_A$ and $IN_B$. Between times T2 and T3, each of input information $IN_A$ and $IN_B$ may swing between $V_A$ and $V_Z$.

As shown in FIG. 3, output information OUT and OUT* may have values of logic 0 and logic 1 based on the relationship between voltage V1 and voltage $V_{DIFF}$. FIG. 3 shows an example where voltage $V_{DIFF}$ is less than voltage V1 between times T0 and T1, and equal to or greater than voltage V1 from time T1 to time T2. Information CLK may be referred to as timing information, and may include a periodic signal (e.g., clock signal) that switches between a signal level 301 and a signal level 302.

When information CLK has signal level 301, transistors 261 and 262 (FIG. 2) may turn off. Thus, both output information OUT and OUT* may have logic 0. As shown in FIG. 3 during example time intervals 303 and 305, both output information OUT and OUT* may have logic 0 when information CLK has a signal level 301. When information CLK has signal level 301, transistors 241 and 242 (FIG. 2) may turn on, and nodes 221 and 222 (FIG. 2) may be precharged to a voltage (e.g., voltage V) at node 230.

When information CLK switches to signal level 302, transistors 261 and 262 (FIG. 2) may turn on. Transistors 251, 271, 252, and 272 (FIG. 2) may form cross-coupled inverters to provide complementary values for output information OUT and OUT* based on the relationship between voltage V1 and voltage $V_{DIFF}$. For example, in FIG. 3, when voltage $V_{DIFF}$ is less than voltage V1 at time interval 304, output information OUT=logic 1 and output information OUT*=logic 0 (as also shown in expression (2) above). In another example, in FIG. 3, when voltage $V_{DIFF}$ equal to or greater than voltage V1 at time interval 306 output information OUT=logic 0 and output information OUT*=logic 1 (as also shown in expression (1) above).

Between times T2 and T3, the value of output information OUT and OUT* may be determined from the relationship between voltage V1 and voltage $V_{DIFF}$, as shown in times intervals 303, 304, 305, and 306.

Figure 4:
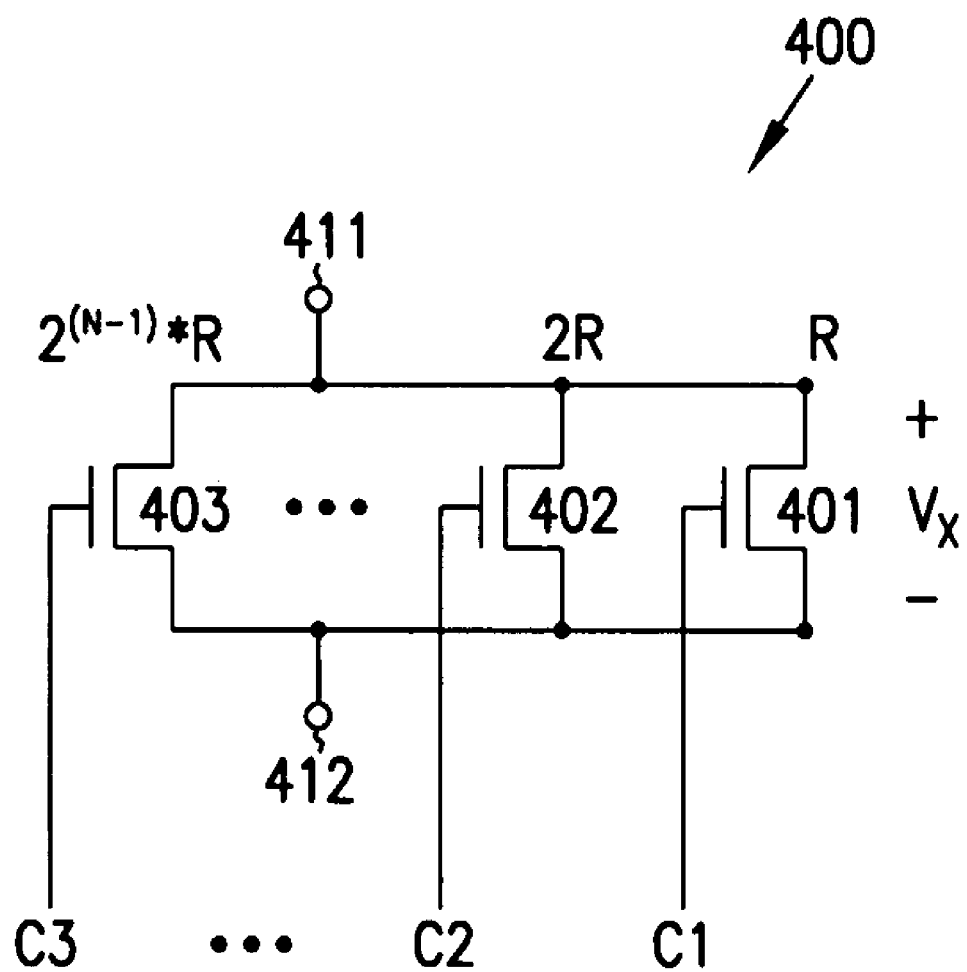
FIG. 4 shows a resistive unit with parallel transistors, which may be used in the converter of FIG. 2.

FIG. 4 shows a resistive unit 400 with parallel transistors 401, 402, and 403. Resistive unit 400 may be used in converter 200 of FIG. 2 to replace one or both of resistive units 293 and 294. In FIG. 4, a resistance value between nodes 411 and 412 may be varied to set a voltage $V_X$ across nodes 411 and 412. Voltage $V_X$ may correspond to voltage V1 or voltage V2 of FIG. 2. Thus, when resistive unit 400 is used in converter 200 of FIG. 2, the resistance value between nodes 411 and 412 may be varied to set the value for voltage $V_X$ to affect a decision point of converter 200.

In FIG. 4, the resistance value of resistive unit 400 may be varied be by using information C1, C2, and C3 to selectively turn on one or more of transistors 401, 402, and 403 to choose the resistance value between nodes 411 and 412. For example, a higher resistance value between nodes 411 and 412 may be obtained when more transistors among transistors 401, 402, and 403 are turned on, and a lower resistance value may be obtained when fewer transistors among transistors 401, 402, and 403 are turned on.

Information C1, C2, and C3 may include signals to turn on transistors 401, 402, and 403. In some embodiment, information C1, C2, and C3 may form digital code to turn on transistors 401, 402, and 403. The digital code formed by information C1, C2, and C3 may be programming codes. Thus, when resistive unit 400 is used in converter 200 of FIG. 2, converter 200 may be programmable such that the value of one or both resistors R1 of R2 may be varied by programming information C1, C2, and C3 to different code values.

In some embodiments, transistors 401, 402, and 403 may include binary weighted transistors such that each of transistors 401, 402, and 403, when the transistor turns on, may have a different resistance value weight. For example, transistors 401, 402, and 403 may have resistance value weights of R, 2R, and $2^{(N-1)}$*R, respectively, where R corresponds to a unit resistance value and N corresponds to the number of the parallel transistors of resistive unit 400. In FIG. 3, where resistive unit 400 includes an example of three transistors, the resistance value weight of transistor 403 is $2^{(3-1)}$*R=4R. Different combinations of 1R, 2R, and 4R may be selected, by choosing the value for information C1, C2, and C3, to obtain different resistance values between nodes 411 and 412. For example, a resistance value of 5R may be obtained by choosing the value for information C1, C2, and C3 to turn on transistors 401 and 403 and turn off transistor 402.

FIG. 4 shows an example where resistive unit 400 includes three transistors. In some embodiments, the number of transistors of resistive unit 400 may change.

Figure 5:
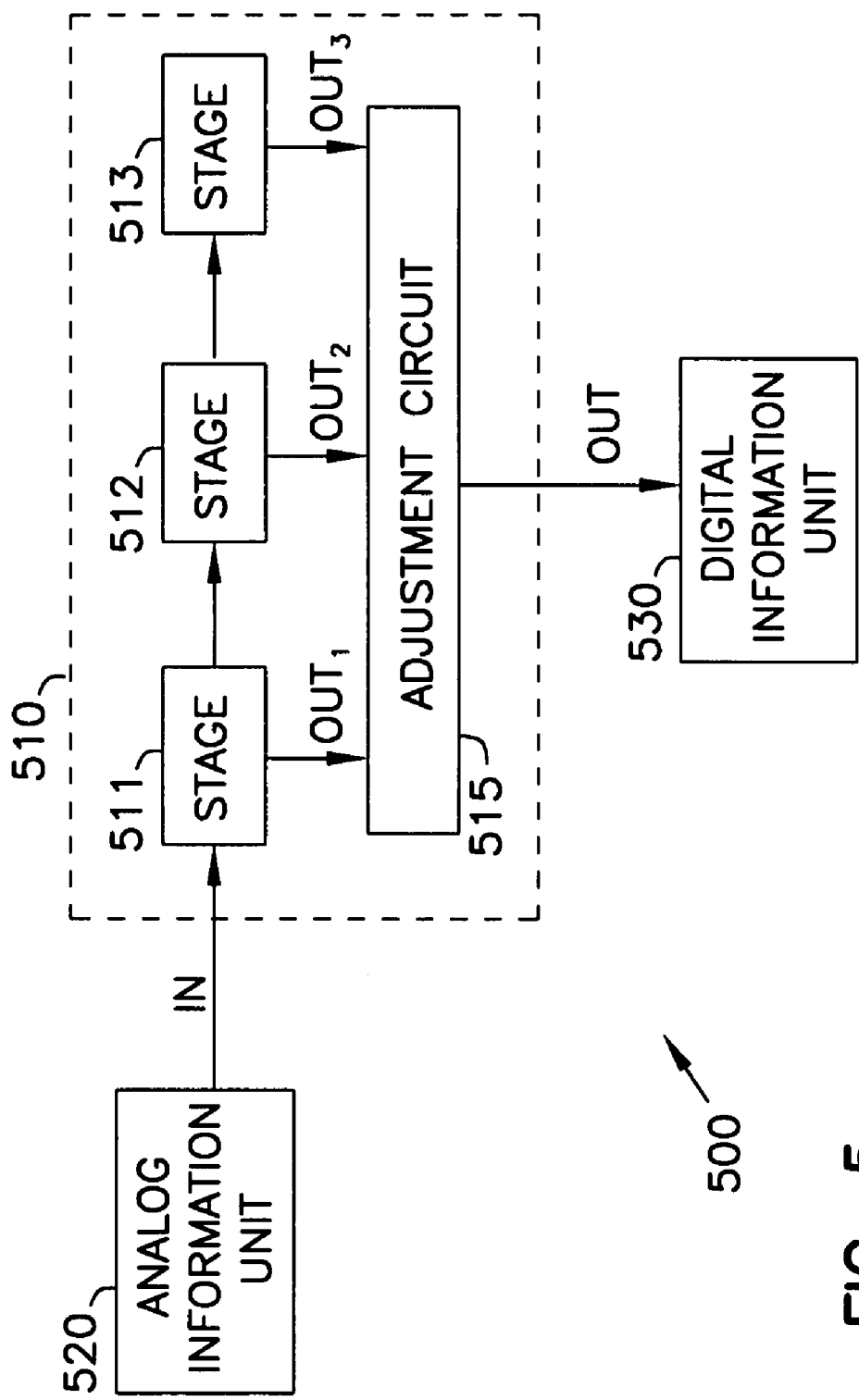
FIG. 5 is a block diagram of an apparatus including a converter with multiple stages according an embodiment of the invention.

FIG. 5 is a block diagram of a converter 510 with multiple stages 511, 512, and 513, according to various embodiments of the invention. Here, three stages are shown. In some embodiments, the number of stages of converter 500 may change to be a lesser or greater number. Each of the stages 511, 512, and 513 may include an embodiment of converter 200 of FIG. 2, and various components may be shared among them. For example, stage 511, 512, and 513 may share the same bias circuit such as circuit 220 of FIG. 2, and each of the stages 511, 512, and 513 may include a separate comparison circuit such as circuit 210 to perform a comparison between components of input information (e.g., $IN_A$ and $IN_B$ of FIG. 2). Thus, converter 510 may include one copy of a circuit, such as circuit 220 of FIG. 2, and multiple copies of a circuit, such as circuit 210 of FIG. 2. Similarly, sharing and copying may occur with respect to other circuits in FIG. 2, with respect to the stages 511, 512, and 513.

As shown in FIG. 5, stages 511, 512, and 513 may be coupled in series, or in a pipeline arrangement, to convert input information IN, which may include analog information, into output information OUT, which may include digital information. Thus, converter 510 maybe considered as a pipelined ADC. An analog information unit 520 may provide IN. A digital information unit 530 may receive output information OUT for further processing.

Input information IN may serially propagate through stages 511, 512, and 513. Each of stages may provide one of information $OUT_1$, $OUT_2$, and $OUT_3$ based on a portion of input information IN. For example, stage 511 may provide information $OUT_1$ based on a first portion of input information IN, and stage 512 may provide information $OUT_2$ based on a second portion of input information IN, and stage 513 may provide information $OUT_3$ based on a third portion of input information IN. Output information OUT may correspond to a combination of information $OUT_1$, $OUT_2$, and $OUT_3$. Each of information $OUT_1$, $OUT_2$, and $OUT_3$ may include a single digital bit or multiple digital bits. These single digital bits or each of the multiple digital bits may include complementary bit values. Converter 510 may include an adjustment circuit 515, which may adjust information $OUT_1$, $OUT_2$, and $OUT_3$ before information $OUT_1$, $OUT_2$, and $OUT_3$ are provided to digital information unit 530 as output information OUT.

Figure 6:
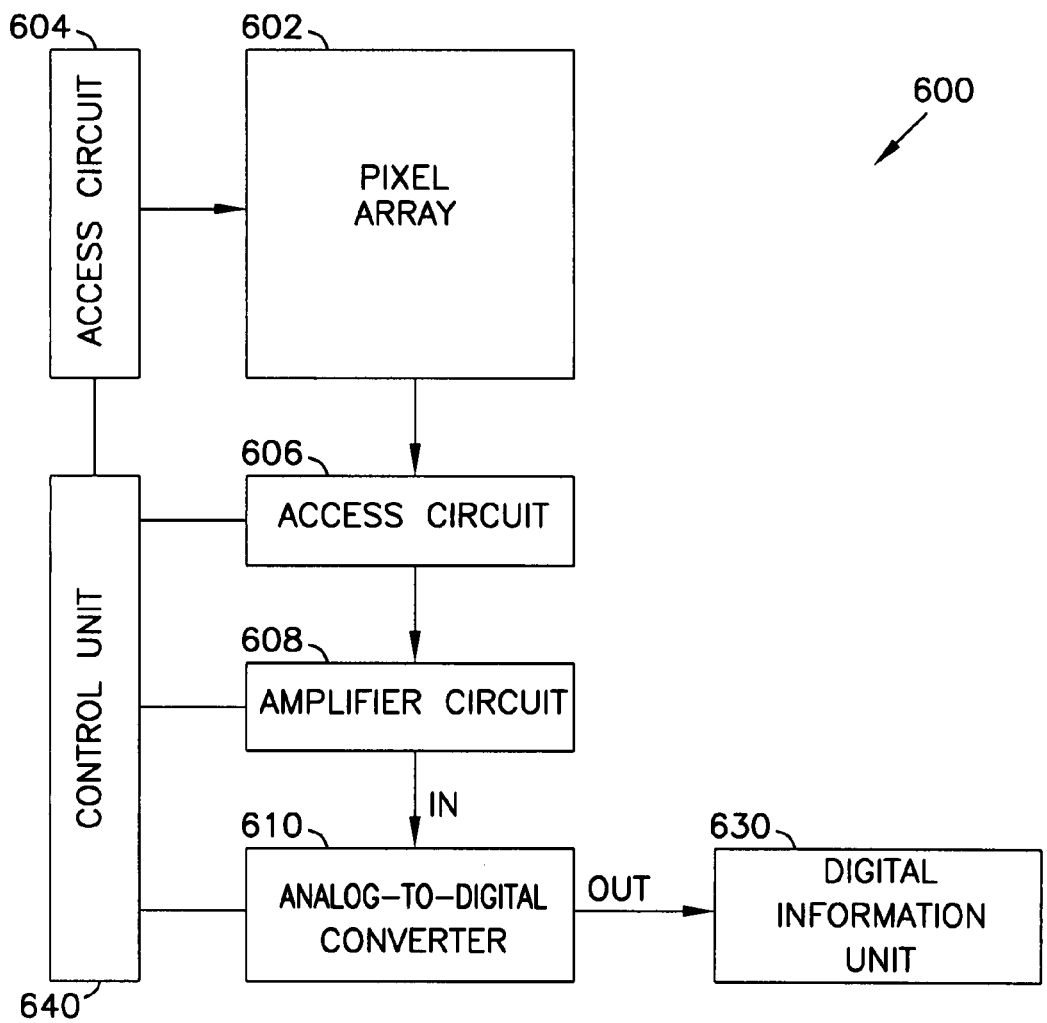
FIG. 6 shows a semiconductor device according an embodiment of the invention.

FIG. 6 shows a semiconductor device 600 according an embodiment of the invention. In some embodiments, semiconductor device 600 may include a sensor device such as an image sensor. Thus, semiconductor device 600 may include a pixel array 602 to store or collect information. For example, pixel array 602 may include rows and columns of pixels that sense light to produce sensed information. The sensed information may be transmitted to other circuitry of semiconductor device 600 for further processing.

Semiconductor device 600 may include access circuits 604 and 606 to access the sensed information in pixel array 602. For example, access circuits 604 and 606 may include row and column decoders, drivers, and latches to access and receive the sensed information in the row and columns of pixels of pixel array 602.

Semiconductor device 600 may include an amplifier circuit 608 to amplify the sensed information from pixel array 602. For example, access circuits 604 and 606 may access pixel array 602 and to receive sensed information of a column of a selected row of pixel array 602. Amplifier circuit 608 may serially amplify the sensed information of the column received from access circuit 606. Amplifier circuit 608 may be differential. Thus, amplifier circuit 608 may amplify the sensed information from pixel array 602 and provide analog information IN, as shown in FIG. 6, where analog information IN may include components such as information $IN_A$ and $IN_B$ of FIG. 2. Thus, analog information IN of FIG. 6 may include different signals.

Semiconductor device 600 may include an ADC 610, which may receive amplified analog information, e.g., IN, from amplifier circuit 608 and provide digital output information, e.g., OUT, to a digital information unit 630. Output information OUT may include complementary values such as output information OUT and OUT* of FIG. 2.

Semiconductor device 600 may include control circuit 640 to control operation of semiconductor device 600 such as providing timing and control information to access circuits 604 and 606, amplifier circuit 608, and the ADC 610.

The ADC 610 may comprise a pipelined ADC, such as pipelined ADC 500 of FIG. 5. Since ADC 500 may include one or more embodiments of converter 200 of FIG. 2, ADC 610 of FIG. 6 may also include one or more embodiments of a converter such as converter 200 of FIG. 2.

Figure 7:
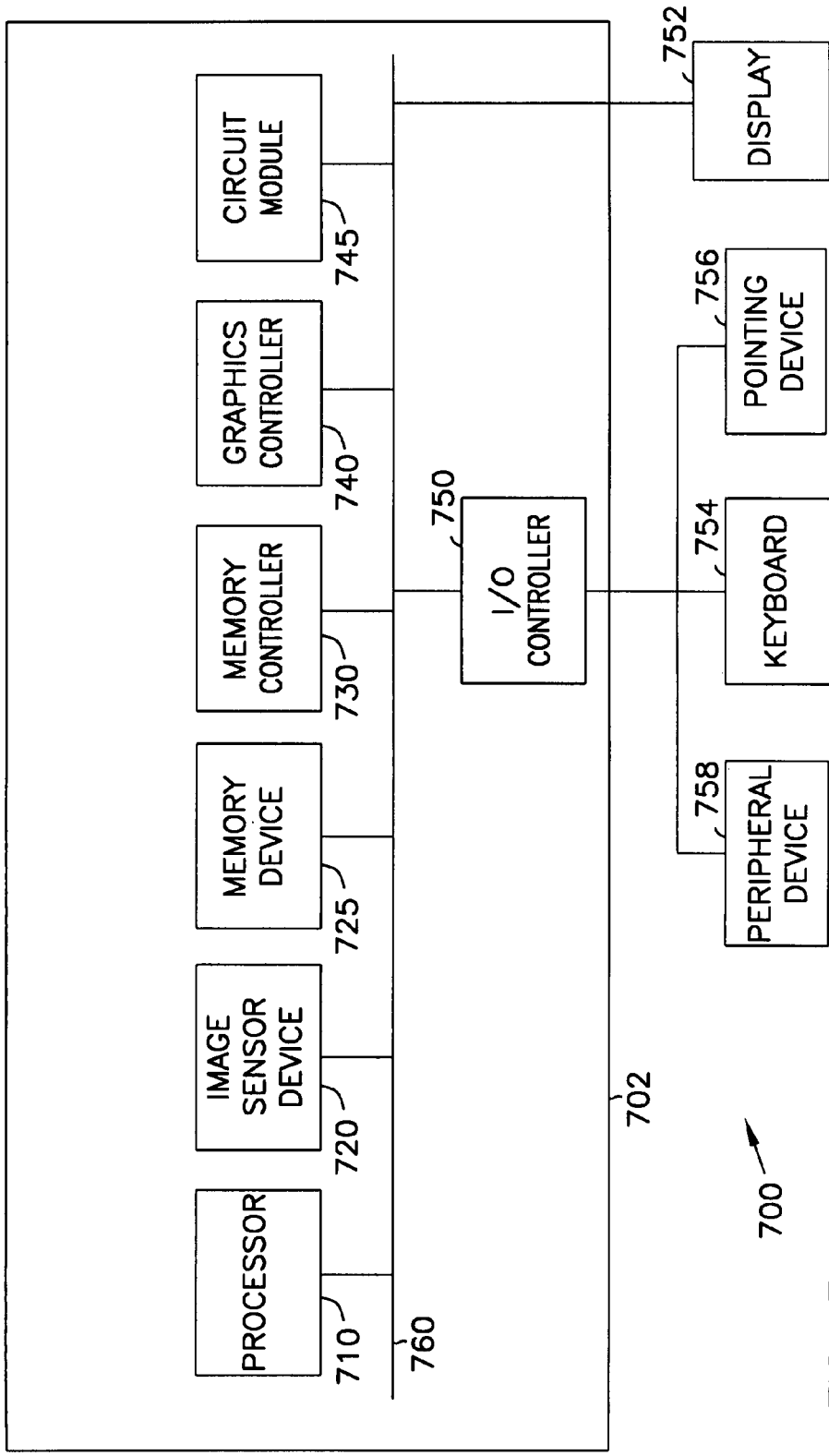
FIG. 7 shows a system according an embodiment of the invention.

FIG. 7 shows a system 700 according to an embodiment of the invention. System 700 may include a processor 710, an image sensor device 720, a memory device 725, a memory controller 730, a graphics controller 740, a circuit module 745, an input and output (I/O) controller 750, a display 752, a keyboard 754, a pointing device 756, a peripheral device 758, and a bus 760 to transfer information among the components of system 700. System 700 may also include a circuit board 702 on which some components of system 700 may be located. In some embodiments, the number of components of system 700 may vary. For example, in some embodiments, system 700 may omit one or more of display 752, image sensor device 720, memory device 725, and circuit module 745.

Processor 710 may include a general-purpose processor or an application specific integrated circuit (ASIC). Processor 710 may comprise a single core processor or a multiple-core processor. Processor 710 may execute one or more programming commands to process information to provide processed information. The information may include digital output information provided by other components of system 700, such as by image sensor device 720 or memory device 725.

Image sensor device 720 may include a complementary metal-oxide-semiconductor (CMOS) image sensor having CMOS a pixel array or charge-coupled device (CCD) image sensor having a CCD pixel array. In some embodiments, image sensor device 720 may include one or more embodiments of the invention, as shown and described with respect to FIG. 1 through FIG. 6 (e.g., apparatus 100 and 500, converter 200, and semiconductor device 600).

Memory device 725 of FIG. 7 may include a volatile memory device, a non-volatile memory device, or a combination of both. For example, memory device 725 may comprise a dynamic random access memory (DRAM) device, a static random access memory (SRAM) device, a flash memory device, or a combination of these memory devices.

Display 752 may include an analog display or a digital display. Display 752 may receive information from other components. For example, display 752 may receive information that is processed by one or more of image sensor device 720, memory device 725, graphics controller 740, and processor 710 to display information such as text or images.

Circuit module 745 may include a circuit module of a vehicle. Circuit module 745 may receive information from other components to activate one or more subsystem of the vehicle. For example, circuit module 745 may receive information that is processed by one or more of image sensor device 720, memory device 725, and processor 710 to activate one or more of an air bag system of a vehicle, a vehicle security alarm, and obstacle alert system.

The illustrations of the apparatus 100 and 500, converter 200, semiconductor device 600, and system 700 are intended to provide a general understanding of the structure of various embodiments, and not as a complete description of all the elements and features of apparatus and systems that might make use of the structures described herein.

The novel apparatus, converters, and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 8:
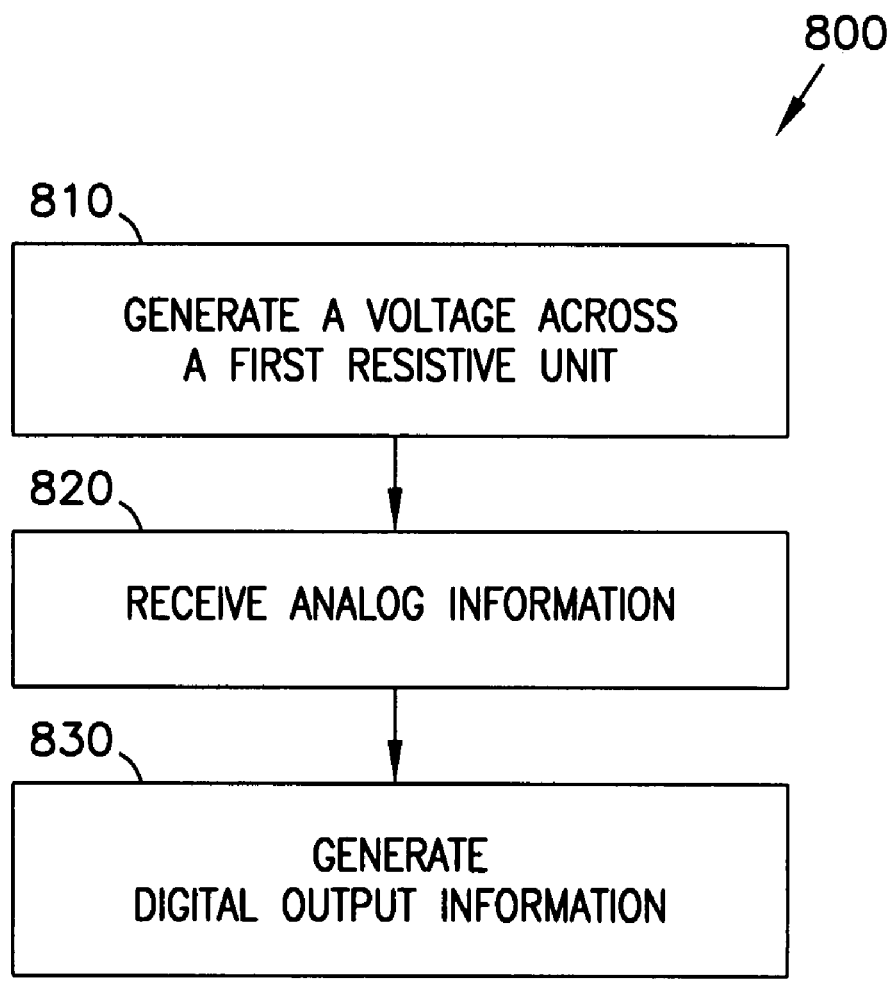
FIG. 8 is a flow diagram showing a method according an embodiment of the invention.

FIG. 8 is a flow diagram showing a method 800 according an embodiment of the invention. In some embodiments, method 800 may be used or included in apparatus and systems that may include converters and semiconductor devices, such as apparatus 100, converter 200, apparatus 500, semiconductor 600, and system 700 described above with reference to FIG. 1 through FIG. 7. Thus, in some embodiments, the circuit elements and components, in method 800 may include the circuit elements and components of the embodiments described above with reference to FIG. 1 through FIG. 7.

Activity 810 of method 800 may generate a voltage across a first resistive unit. The first resistive unit may couple in series with transistors of a first circuit branch. Activity 820 may receive analog information. The analog information may include first and second components. The first component may be received at the first circuit branch. The second component may be received at a transistor of a second circuit branch. Activity 830 may generate digital output information. The digital output information may be generated based on a relationship between the voltage across the first resistive unit and a voltage difference between first and second components of the analog information.

The individual activities of method 800 may not have to be performed in the order shown or in any particular order. Some activities may be repeated, and others may occur only once. Various embodiments may have more or fewer activities than those shown in FIG. 8. For example, in some embodiments, method 800 may include the activities or operations of apparatus 100, converter 200, apparatus 500, semiconductor 600, and system 700 described above with reference to FIG. 1 through FIG. 7. In some embodiments, method 800 may include an embodiment of method 900 of FIG. 9 described below.

Figure 9:
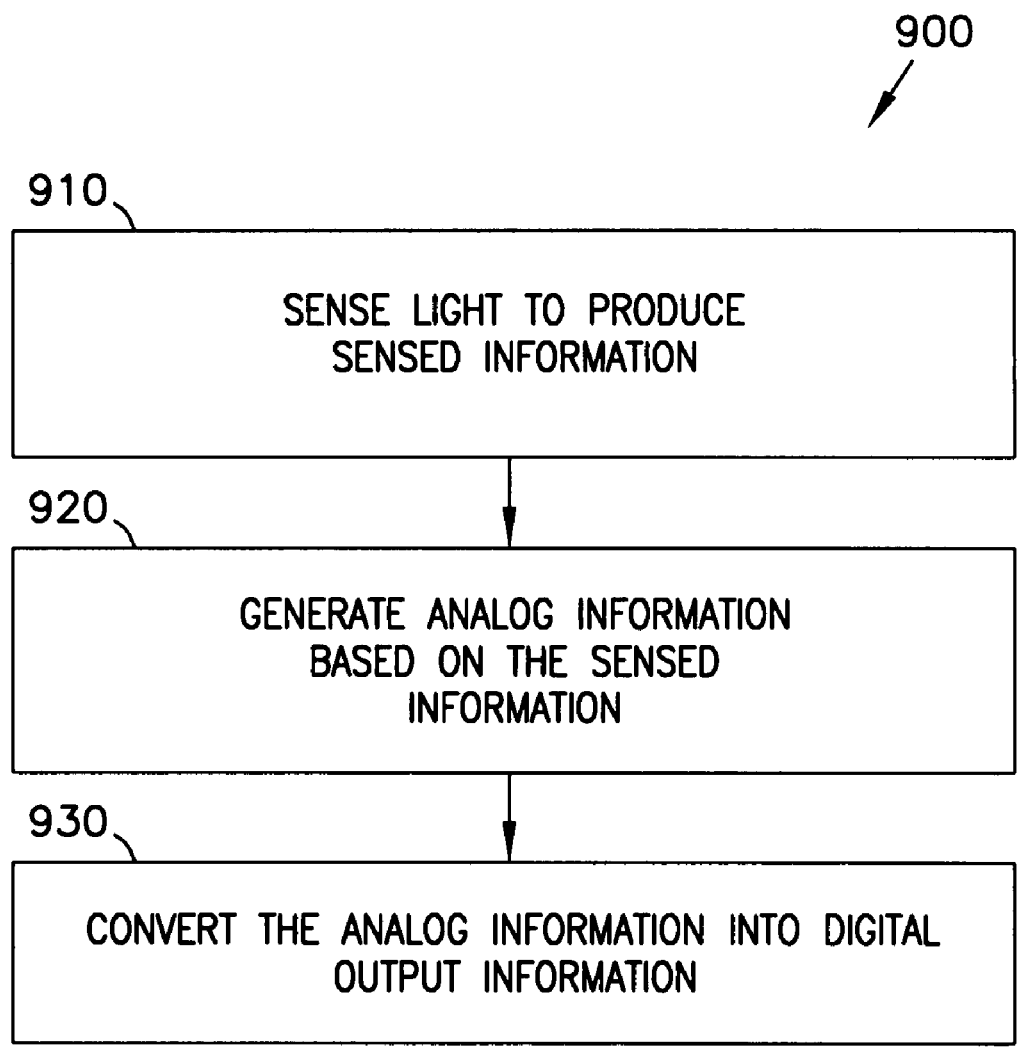
FIG. 9 is a flow diagram showing another method according an embodiment of the invention.

FIG. 9 is a flow diagram showing method 900 according an embodiment of the invention. In some embodiments, method 900 may be used or included in apparatus and systems that may include converters and semiconductor devices, such as apparatus 100, converter 200, apparatus 500, semiconductor 600, and system 700 described above with reference to FIG. 1 through FIG. 7. Thus, in some embodiments, the circuit elements and components, in method 900 may include the circuit elements and components of the embodiments described above with reference to FIG. 1 through FIG. 7.

Activity 910 of method 900, may sense light to produce sensed information. Activity 920 may generate analog information based on the sensed information. Activity 930 may convert the analog information into digital output information. The conversion from the analog information into digital output information may use an analog-to-digital converter.

The individual activities of method 900 may not have to be performed in the order shown or in any particular order. Some activities may be repeated, and others may occur only once. Various embodiments may have more or fewer activities than those shown in FIG. 9. For example, in some embodiments, method 900 may include the activities or operations of apparatus 100, converter 200, apparatus 500, semiconductor 600, and system 700 described above with reference to FIG. 1 through FIG. 7. In some embodiments, method 900 may include an embodiment of method 800 of FIG. 8 described above.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
a first circuit branch comprising first transistors coupled in series between first and second supply nodes;
a second circuit branch coupled to the first circuit branch and comprising second transistors coupled in series between the first and second supply nodes, and a first resistive unit coupled in series with the second transistors, the first and second circuit branches to receive analog input information and to provide digital output information, the digital output information having output values based on a relationship between a voltage across the first resistive unit and a voltage difference between first and second components of the analog input information; and
a circuit coupled to the first and second branches, the circuit comprising a second resistive unit and a node to receive a first voltage to generate a first current through the second resistive unit, and wherein the voltage across the first resistive unit is a function of the first voltage and a ratio of a resistance value of the first resistive unit and a resistance value of the second resistive unit.

2. The apparatus of claim 1, wherein the first and second circuit branches are to provide digital output information having a first output value included in the output values when the voltage difference is greater than the voltage across the first resistive unit, and the first and second circuit branches are to provide digital output information having a second output value included in the output values when the voltage difference is less than the voltage across the first resistive unit.

3. The apparatus of claim 1, wherein the first resistive unit comprises a resistor coupled in series with the second transistors.

4. The apparatus of claim 1, wherein the first resistive unit comprises transistors coupled in parallel with each other.

5. The apparatus of claim 1, wherein the first transistors and the second transistors have an equal number of transistors.

6. The apparatus of claim 1, wherein the first transistors comprise five transistors.

7. The apparatus of claim 1, wherein the first and second circuit branches comprise an unequal number of circuit elements between the first and second supply nodes.

8. The apparatus of claim 1, wherein one of the first transistors comprises a first gate to receive the first component of the analog input information, and wherein one of the second transistors comprises a second gate to receive the second component of the analog input information.

9. The apparatus of claim 8, wherein the first branch comprises a first output node to provide a first component of the digital output information, and wherein the second branch comprises a second output node to provide a second component of the digital output information.

10. The apparatus of claim 1, wherein the ratio of the resistance value of the first resistive unit and the resistance value of the second resistive unit is equal to one.

11. The apparatus of claim 1, wherein the circuit comprises a circuit portion coupled to the second circuit branch to provide a current mirror.

12. The apparatus of claim 1, wherein the circuit portion is coupled to the first circuit branch to provide a current mirror.

13. An apparatus comprising:
a pair of input transistors to receive analog input information;
an output unit to provide digital output information related to the analog input information, the output unit being coupled to a first supply node and the pair of input transistors;
a pair of first additional transistors coupled to a second supply node and the pair of input transistors;
a first resistive unit coupled in series with a first input transistor of the pair of input transistors and a first additional transistor of the pair of first additional transistors; and
a circuit coupled to the pair of first additional transistors, wherein the circuit comprises a second resistive unit, and a first node to receive a first voltage to generate a current through the second resistive unit, and wherein a voltage across the first resistive unit is a function of the current and a resistance value of the first resistor.

14. The apparatus of claim 13, wherein the circuit comprises an operational amplifier having a first input node coupled to the first node, a second input node coupled to the second resistive unit, and an output node coupled to a gate of a transistor of the circuit, and wherein the transistor of the circuit is coupled in series with the second resistive unit between the first and second supply nodes.

15. The apparatus of claim 13, wherein at least one of the first and second resistive units comprises a resistor.

16. The apparatus of claim 13, wherein at least one of the first and second resistive units comprises transistors coupled in parallel with each other.

17. The apparatus of claim 16, wherein the transistors coupled in parallel with each other comprise binary weighted transistors.

18. The apparatus of claim 13, wherein a resistance value of the first resistance unit is substantially equal to a resistance value of the second resistance unit.

19. The apparatus of claim 13 comprising:
a pair of additional input transistors to receive the analog input information;
an additional output unit to provide additional digital output information related to the analog input information, the additional output unit coupled to the first supply node and the pair of additional input transistors;
a pair of second additional transistors coupled to the second supply node and the pair of additional input transistors; and
a third resistive unit coupled in series with a transistor of the pair of additional input transistors and a transistor of the pair of second additional transistors, wherein the voltage across the third resistive unit is a function of the current and a resistance value of the third resistor.

20. The apparatus of claim 19, wherein the output unit comprises:

a first output node to provide a first component of the digital output information;
a second output node to provide a second component of the digital output information;
a pair of first transistors coupled in series between the first and second supply nodes to provide an inversion of the second component, the pair of first transistors comprising gates coupled to the second output node, and a first non-gate terminal coupled to the first output node; and
a pair of second transistors coupled in series between the first and second supply nodes to provide an inversion of the first component, the pair of second transistors comprising gates coupled to the first output node, and a first non-gate terminal coupled to the second output node.

21. The apparatus of claim 20, wherein the output unit comprises:
a transistor comprising a first non-gate terminal coupled to the first supply node, a second non-gate terminal coupled to the first output node, and a first gate to receive timing information;
a transistor comprising a first non-gate terminal coupled to the first supply node, a second non-gate terminal coupled to the second output node, and a second gate to receive the timing information;
a transistor coupled between the first output node and a second non-gate terminal of the pair of first transistors, and a gate coupled to the first gate; and
a transistor coupled between the second output node and a second non-gate terminal of the pair of second transistors, and a gate coupled to the second gate.

22. An apparatus comprising:
a circuit unit to provide analog information; and
an analog-to-digital converter comprising stages coupled in series, each of the stages to provide digital information based on at least a portion of the analog information, each of the stages comprising:
a first circuit branch comprising first transistors coupled in series between first and second supply nodes; and
a second circuit branch coupled to the first circuit branch and comprising second transistors coupled in series between the first and second supply nodes, and a first resistive unit coupled in series with the second transistors, the first and second circuit branches to receive the analog input information and to provide the digital output information, the digital output information having output values based on a relationship between a voltage across the first resistive unit and a voltage difference between first and second components of the analog input information, wherein each of the stages is to provide the digital output information having a first output value included in the output values when a voltage difference is greater than the voltage across the first resistive unit, and wherein each of the stages is to provide the digital output information having a second output value included in the output values when the voltage difference is less than the voltage across the first resistive unit.

23. An apparatus comprising:
a circuit unit to provide analog information; and
an analog-to-digital converter comprising stages coupled in series, each of the stages to provide digital information based on at least a portion of the analog information, each of the stages comprising:
a first circuit branch comprising first transistors coupled in series between first and second supply nodes; and
a second circuit branch coupled to the first circuit branch and comprising second transistors coupled in series between the first and second supply nodes, and a first resistive unit coupled in series with the second transistors, the first and second circuit branches to receive the analog input information and to provide the digital output information, the digital output information having output values based on a relationship between a voltage across the first resistive unit and a voltage difference between first and second components of the analog input information, wherein the analog-to-digital converter comprises a second resistive unit, and a first node to receive a first voltage to generate a current through the second resistive unit, and wherein the voltage across the first resistive unit of each of the stages is a function of the current and a resistance value of the first resistor.

24. The semiconductor of claim 23, wherein the voltage across the first resistive unit of each of the stages is a function of the first voltage and a ratio of a resistance value of the first resistive unit of each of the stages and a resistance value of the second resistive unit.

25. An apparatus comprising:
a circuit unit to provide analog information; and
an analog-to-digital converter comprising stages coupled in series, each of the stages to provide digital information based on at least a portion of the analog information, each of the stages comprising:
a first circuit branch comprising first transistors coupled in series between first and second supply nodes; and
a second circuit branch coupled to the first circuit branch and comprising second transistors coupled in series between the first and second supply nodes, and a first resistive unit coupled in series with the second transistors, the first and second circuit branches to receive the analog input information and to provide the digital output information, the digital output information having output values based on a relationship between a voltage across the first resistive unit and a voltage difference between first and second components of the analog input information, wherein a first stage of the stages is to provide a plurality of first bits of the digital information based on a first portion of the analog information.

26. The semiconductor device of claim 25, wherein a second stage of the stages is to provide a plurality of second bits of the digital information based on a second portion of the analog information.

27. A semiconductor device comprising:
a pixel array to sense light to produce sensed information;
a first circuit to provide analog information based on the sensed information;
an analog-to-digital converter to provide digital information based on the analog information, the analog-to-digital converter comprising:
a pair of input transistors to receive the analog information;
an output unit to provide the digital output information, the output unit coupled to a first supply node and the pair of input transistors;
a pair of additional transistors coupled to a second supply node and the pair of input transistors; and
a first resistor coupled in series with an input transistor of the pair of input transistors and an additional transistor of the pair of additional transistors, wherein the analog-to-digital converter comprises a second resistor, and a first node to receive a first voltage to generate a current through the second resistor, wherein the voltage across the first resistor is a function of the first voltage and a ratio of a resistance value of the first resistor and a resistance value of the second resistor; and a second circuit to receive the digital information.

28. The semiconductor device of claim 27, wherein the first circuit comprises an amplifier to amplify the sensed information to provide the analog information.

29. The semiconductor device of claim 28, wherein the second circuit comprises memory cells to store the digital information.

30. The semiconductor device of claim 27, wherein the pixel array comprises a complementary metal-oxide-semiconductor (CMOS) pixel array.

31. The semiconductor device of claim 27, wherein the pixel array comprise a charge-coupled device (CCD) pixel array.

32. A system comprising:
a pixel array to sense light to produce sensed information;
an amplifier to provide analog information based on the sensed information;
an analog-to-digital converter to convert the analog information into digital information, the analog-to-digital converter comprising:
  a first circuit branch comprising first transistors coupled in series between first and second supply nodes; and
  a second circuit branch coupled to the first circuit branch and comprising second transistors coupled in series between the first and second supply nodes, and a first resistor coupled in series with the second transistors, the first and second circuit branches to receive the analog information and to provide the digital output information, the digital output information having output values based on a relationship between a voltage across the first resistor and a voltage difference between first and second components of the analog information, wherein the analog-to-digital converter comprises a second resistor, and a first node to receive a first voltage to generate a current through the second resistor, wherein the voltage across the first resistor is a function of the current and a resistance value of the first resistor; and
a processor to execute a program command to process the digital output information to provide processed information; and
a display to display the processed information.

33. The system of claim 32, wherein the voltage across the first resistor and a voltage across the second resistor are substantially equal.

34. A system comprising:
a pixel array to sense light to produce sensed information;
an amplifier to provide analog information based on the sensed information;
an analog-to-digital converter to convert the analog information into digital information, the analog-to-digital converter comprising:
  a first circuit branch comprising first transistors coupled in series between first and second supply nodes; and
  a second circuit branch coupled to the first circuit branch and comprising second transistors coupled in series between the first and second supply nodes, and a first resistor coupled in series with the second transistors, the first and second circuit branches to receive the analog information and to provide the digital output information, the digital output information having output values based on a relationship between a voltage across the first resistor and a voltage difference between first and second components of the analog information, wherein the first and second circuit branches are to receive the first component having a first voltage range, wherein a smallest voltage of the first voltage range is at least equal to a threshold voltage of the first transistor, wherein the first and second circuit branches are to receive the second component having a second voltage range, and wherein a smallest voltage of the second voltage range is at least equal to a threshold voltage of the second transistor; and
a processor to execute a program command to process the digital output information to provide processed information; and
a display to display the processed information.

35. A system comprising:
a pixel array to sense light to produce sensed information;
an amplifier to provide analog information based on the sensed information;
an analog-to-digital converter to convert analog information into digital information, the analog-to-digital converter comprising:
  a first circuit branch comprising first transistors coupled in series between first and second supply nodes; and
  a second circuit branch coupled to the first circuit branch and comprising second transistors coupled in series between the first and second supply nodes, and a first resistor coupled in series with the second transistors, the first and second circuit branches to receive the analog information and to provide the digital output information, the digital output information having output values based on a relationship between a voltage across the first resistor and a voltage difference between first and second components of the analog information, wherein the analog-to-digital converter comprises a second resistor, and a first node to receive a first voltage to generate a current through the second resistor, wherein the voltage across the first resistor is a function of the current and a resistance value of the first resistor; and
a processor to execute a program command to process the digital output information to provide processed information; and
a circuit module of a vehicle to receive the processed information.

36. The system of claim 35, wherein a resistance value of the first resistor is substantially equal to a resistance value of the second resistor.

37. A method comprising:
generating a voltage across a first resistive unit coupled in series with transistors of a first circuit branch, wherein generating the voltage across the first resistive unit comprises receiving a first voltage, and generating a first current through a second resistive unit using the first voltage, wherein a current through the first resistive unit is related to the first current by the voltage across the first resistive unit being a function of the first voltage and a ratio of a resistance value of the first resistor and a resistance value of the second resistive unit;
receiving a first component of analog information at one of the transistors of the first circuit branch;
receiving a second component of the analog information at a transistor of a second circuit branch; and
generating digital output information based on a relationship between the voltage across the first resistive unit and a voltage difference between first and second components of the analog information.

38. The method of claim 37, wherein generating the digital output information comprises:
- generating a first output value of the digital output information when a voltage difference between the first and second components of the analog information is greater than the voltage across the first resistive unit, and
- generating a second output value of the digital output information when the voltage difference is less than the voltage across the first resistive unit.

39. The method of claim 38, wherein the first output value comprises a logic one value, and wherein the second output value comprises a logic zero.

40. The method of claim 38, wherein the first component of the analog information is received at a gate of a first transistor of the first circuit branch, and the second component of the analog information is received at a gate of a second transistor of the second circuit branch.

41. The method of claim 40, wherein the first component of the analog information has a first voltage range, wherein a smallest voltage of the first voltage range is at least equal to a threshold voltage of the first transistor, wherein the second component of the analog information has a second voltage range, and wherein a smallest voltage of the second voltage range is at least equal to a threshold voltage of the second transistor.

42. The method of claim 40, wherein the first and second components of the analog information comprise differential signals.

43. The method of claim 40, wherein the first and second components of the analog information comprise single-ended signals.

44. The method of claim 37 comprising:
mirroring the first current to generate the current through the first resistive unit.

45. A method comprising:
- sensing light to produce sensed information;
- generating analog information based on the sensed information; and
- converting the analog information into digital Output information using an analog-to-digital converter, wherein the converting comprises:
  - generating a voltage across a first resistive unit coupled in series with transistors of a first circuit branch of the analog-to-digital converter;
  - receiving a first component of the analog information at one of the transistors of the first circuit branch;
  - receiving a second component of the analog information at a transistor of a second circuit branch the analog-to-digital converter; and
  - generating the digital output information based on a relationship between the voltage across the first resistive unit and a voltage difference between first and second components of the analog information, and generating a first current through a second resistor of the analog-to-digital converter using a second voltage, wherein the first voltage is a function of the second voltage and a ratio of a resistance value of the first resistor and a resistance value of the second resistor.

46. The method of claim 45 comprising:
amplifying the sensed information to generate the analog information.

* * * * *